(12) United States Patent
Raman et al.

(10) Patent No.: US 9,028,708 B2
(45) Date of Patent: May 12, 2015

(54) PROCESS FOR REMOVING A BULK MATERIAL LAYER FROM A SUBSTRATE AND A CHEMICAL MECHANICAL POLISHING AGENT SUITABLE FOR THIS PROCESS

(75) Inventors: Vijay Immanuel Raman, Mannheim (DE); Yuzhuo Li, Heidelberg (DE); Mario Brands, Ludwigshafen (DE); Yongqing Lan, Potsdam, NY (US); Kenneth Rushing, Ludwigshafen (DE); Karpagavalli Ramji, Chicago, IL (US)

(73) Assignee: BASF SE, Ludwigshafen (DE)

( * ) Notice: Subject to any disclaimer, the term of this patent is extended or adjusted under 35 U.S.C. 154(b) by 199 days.

(21) Appl. No.: 13/510,514

(22) PCT Filed: Nov. 25, 2010

(86) PCT No.: PCT/IB2010/055427
§ 371 (c)(1),
(2), (4) Date: May 17, 2012

(87) PCT Pub. No.: WO2011/064735
PCT Pub. Date: Jun. 3, 2011

(65) Prior Publication Data
US 2012/0231627 A1 Sep. 13, 2012

Related U.S. Application Data

(60) Provisional application No. 61/264,858, filed on Nov. 30, 2009.

(51) Int. Cl.
*C09K 13/00* (2006.01)
*H01L 21/321* (2006.01)
*C09G 1/02* (2006.01)
*C09K 3/14* (2006.01)

(52) U.S. Cl.
CPC .............. *H01L 21/3212* (2013.01); *C09G 1/02* (2013.01); *C09K 3/1463* (2013.01)

(58) Field of Classification Search
CPC ......... C09G 1/02; C23F 3/00; H01L 21/3212; H01L 21/30625
USPC ................ 252/79.1, 79.3, 79.4; 438/692, 693
See application file for complete search history.

(56) References Cited

U.S. PATENT DOCUMENTS

| 578,882 | A | | 3/1897 | Kennedy |
| 4,339,356 | A | * | 7/1982 | Whyte .............................. 512/4 |
| 5,057,560 | A | | 10/1991 | Mueller |
| 6,068,787 | A | | 5/2000 | Grumbine et al. |
| 6,576,554 | B2 | | 6/2003 | Matsui et al. |
| 6,620,215 | B2 | | 9/2003 | Li et al. |
| 6,682,642 | B2 | | 1/2004 | Mikkola et al. |
| 7,037,351 | B2 | | 5/2006 | Li et al. |
| 7,161,602 | B2 | | 1/2007 | Shan |
| 7,250,391 | B2 | | 7/2007 | Kanno et al. |
| 7,300,601 | B2 | | 11/2007 | Liu et al. |
| 7,361,603 | B2 | | 4/2008 | Liu et al. |
| 7,419,519 | B2 | | 9/2008 | Li et al. |
| 2002/0198328 | A1 | | 12/2002 | L'alloret |
| 2003/0136055 | A1 | | 7/2003 | Li et al. |
| 2004/0209095 | A1 | | 10/2004 | Manias et al. |
| 2004/0217009 | A1 | | 11/2004 | Mikkola et al. |
| 2005/0014667 | A1 | | 1/2005 | Aoyama et al. |
| 2005/0176259 | A1 | | 8/2005 | Yokoi et al. |
| 2005/0266683 | A1 | | 12/2005 | Lee |
| 2006/0024434 | A1 | * | 2/2006 | Wang et al. .................... 427/212 |
| 2006/0141254 | A1 | | 6/2006 | Kramer et al. |
| 2006/0213780 | A1 | | 9/2006 | Shih et al. |
| 2007/0029198 | A1 | | 2/2007 | Kooi |
| 2007/0251157 | A1 | * | 11/2007 | Golzarian et al. ............... 51/307 |
| 2007/0289875 | A1 | | 12/2007 | Paneccasio, Jr. et al. |
| 2008/0050435 | A1 | | 2/2008 | Hennink et al. |
| 2008/0142375 | A1 | * | 6/2008 | Doniat et al. ................. 205/662 |
| 2008/0249210 | A1 | | 10/2008 | Entenmann et al. |

(Continued)

FOREIGN PATENT DOCUMENTS

CN   1333319   1/2002
CN   1860198   11/2006

(Continued)

OTHER PUBLICATIONS

"Benzotriazole"; Wikipedia, the Free Encyclopedia; http://en.wikipedia.org/wiki/Benzotriazole ; pp. 1-4; 2014.*
Industrial Chemical; Tolyltriazole-PAT Products; http://www.patproducts.com/tolyltriazole/ ; pp. 1-2; no date available.*
Standard Reduction Potentials at 25° C. (298° K) for Many Common Half Reactions ; http://butane.chem.uiuc.edu/cyerkes/Chem104ACSpring2009/Genchemref/standpot.html ; p. 1; no date available.*
5-Aminotetrazole; ChemSpider; http://www.chemspider.com/Chemical-Structure.19274.html ; pp. 1-3; no date available.*
"Pluronic and Tetronic Block Copolymer Surfactants, 1996," BASF Corporation, Total 42 Pages, (1996).

(Continued)

*Primary Examiner* — Binh X Tran
(74) *Attorney, Agent, or Firm* — Oblon, McClelland, Maier & Neustadt, L.L.P.

(57) ABSTRACT

An aqueous chemical mechanical polishing (CMP) agent (A) comprising solid particles (a1) containing (a11) a corrosion inhibitor for metals, and (a12) a solid material, the said solid particles (a1) being finely dispersed in the aqueous phase; and its use in a process for removing a bulk material layer from the surface of a substrate and planarizing the exposed surface by chemical mechanical polishing until all material residuals are removed from the exposed surface, wherein the CMP agent exhibits at the end of the chemical mechanical polishing, without the addition of supplementary materials, —the same or essentially the same static etch rate (SER) as at its start and a lower material removal rate (MRR) than at its start, —a lower SER than at its start and the same or essentially the same MRR as at its start or—a lower SER and a lower MRR than at its start; such that the CMP agent exhibits a soft landing behavior.

18 Claims, No Drawings

(56) References Cited

U.S. PATENT DOCUMENTS

| | | | |
|---|---|---|---|
| 2008/0254628 A1* | 10/2008 | Boggs et al. | 438/693 |
| 2008/0280452 A1 | 11/2008 | Yokoi et al. | |
| 2009/0013609 A1 | 1/2009 | Gupta et al. | |
| 2009/0211595 A1* | 8/2009 | Sinha | 134/1 |
| 2011/0269312 A1 | 11/2011 | Li et al. | |
| 2012/0045970 A1 | 2/2012 | Li et al. | |
| 2012/0058641 A1 | 3/2012 | Raman et al. | |
| 2012/0058643 A1 | 3/2012 | Raman et al. | |
| 2012/0077419 A1 | 3/2012 | Zhang et al. | |

FOREIGN PATENT DOCUMENTS

| | | |
|---|---|---|
| CN | 101128555 | 2/2008 |
| DE | 26 10 705 | 9/1977 |
| EP | 0 583 814 | 2/1994 |
| EP | 1 036 836 | 9/2000 |
| EP | 1 197 587 | 4/2002 |
| EP | 1 306 415 | 5/2003 |
| EP | 1 942 179 | 7/2008 |
| WO | 01 60926 | 8/2001 |
| WO | 2004 029160 | 4/2004 |
| WO | 2004 052946 | 6/2004 |
| WO | 2004 063301 | 7/2004 |
| WO | 2005 014753 | 2/2005 |
| WO | 2006 074248 | 7/2006 |
| WO | 2006 093242 | 9/2006 |
| WO | 2007 012763 | 2/2007 |

OTHER PUBLICATIONS

Schmaljohann, D., "Thermo- and pH-responsive polymers in drug delivery," Advanced Drug Delivery Reviews, vol. 58, pp. 1655-1670, (Oct. 18, 2006).
Mori, H., et al., "Controlled synthesis of thermoresponsive polymers derived from L-proline via RAFT polymerization," Chemical Communication, pp. 4872-4874, (Aug. 31, 2005).
International Search Report Issued Apr. 21, 2011 in PCT/IB10/55427 Filed Nov. 25, 2010.
U.S. Appl. No. 13/510,830, filed May 18, 2012, Raman, et al.
U.S. Appl. No. 13/503,753, filed Apr. 24, 2012, Lauter, et al.
U.S. Appl. No. 13/580,039, filed Aug. 20, 2012, Raman, et al.
U.S. Appl. No. 14/006,744, filed Sep. 23, 2013, Noller, et al.
U.S. Appl. No. 14/356,530, filed May 6, 2014, Seyffer, et al.

* cited by examiner

PROCESS FOR REMOVING A BULK MATERIAL LAYER FROM A SUBSTRATE AND A CHEMICAL MECHANICAL POLISHING AGENT SUITABLE FOR THIS PROCESS

FIELD OF THE INVENTION

The invention is directed to a novel process for removing a bulk material layer from a substrate and a chemical mechanical polishing agent suitable for this process.

CITED DOCUMENTS

The documents cited in the present application are incorporated by reference in their entirety.

BACKGROUND OF THE INVENTION

Integrated circuits (ICs) consist of structured electrically semiconducting, non-conducting and conducting thin layers. These patterned layers are customarily prepared by applying a layer material, for example, by vapor deposition and patterning it by a microlithographic process. By way of the combination of the various electrically semiconducting, non-conducting and conducting layered materials the electronic circuit elements such as transistors, capacitors, resistors and wirings are fabricated.

The quality of an IC and of its function depends particularly on the precision with which the various layer materials can be applied and patterned.

However, with an increasing number of layers the planarity of the layers decreases significantly. This leads to the failure of one or more functional elements of the IC and, therefore, to the failure of the complete IC after a certain number of layers has been reached.

The decrease of the planarity of the layers is caused by the buildup of new layers on top of layers already patterned. By the patterning altitude differences are created which can add up to 0.6 µm per layer. These altitude differences add up from layer to layer and bring about that the next following layer can no longer be applied onto a planar surface but only onto an uneven surface. The first result is that the layer subsequently applied has an irregular thickness. In extreme cases, imperfections, defects in the electronic functional elements and lacking electrical contacts are caused. Moreover, uneven surfaces lead to problems with the patterning. In order to be able to create sufficiently small patterns, an extremely acute depth of focus is a necessary in the microlithographic process step. However, these patterns can only be imaged with acuity on a planar surface. The more the locations deviate from the planarity, the murkier the image becomes.

In order to solve this problem, a so-called chemical mechanical polishing (CMP) is carried out. The CMP causes a global planarization of the patterned surface by the removal of protruding features of the layer until a planar layer is obtained. Because of this, the subsequent buildup can take place on top of a planar surface exhibiting no altitude differences, and the precision of the patterning and of the functionality of the elements of the IC is maintained.

Typical examples for the global planarization are dielectric CMP, nickel phosphide CMP and silicium or polysilicium CMP.

In addition to the global planarization to overcome lithographical difficulties, there are two other important applications for CMP. One is to fabricate microstructures. Typical examples for this application are copper CMP, tungsten CMP or shallow trench isolation (STI) CMP, in particular the Damascene process described below. The other is defect correction or elimination, as for example sapphire CMP.

A CMP process step is carried out with the help of special polishers, polishing pads and polishing agents which are also referred to in the art as polishing slurries or CMP slurries. A CMP slurry is a composition, which in combination with the polishing pad causes the removal of the material to be polished.

In case that wafers with semiconductor layers are to be polished, the precision requirements for the process step and, thus, the requirements set for the CMP slurry are particularly strict.

A series of parameters are used for evaluating the efficiency of CMP slurries and for characterizing their activity. The material removal rate (MRR), that is the speed with which the material to be polished is removed, the selectivity, that is the ratio of the removal rate of the material to be polished to the removal rates of other materials present, the removal uniformity within a wafer (WIWNU; Within-Wafer-Non-Uniformity) and the removal uniformity from wafer to wafer (WTWNU; Wafer-to-Wafer-Non-Uniformity) as well as the number of defects per unit of area rank among these parameters.

The copper Damascene process is increasingly used for the fabrication of IC (cf., for example, the European patent application EP 1 306 415 A2, page 2, paragraph [0012]). In order to produce the copper circuit paths, it is necessary to remove a copper layer chemically mechanically in this process with the help of a CMP slurry, which process is also called "copper CMP process" in the art. The completed copper circuit paths are embedded in a dielectric. Customarily, a barrier layer customarily consisting of tantalum or tantalum nitride is located between the copper and the dielectric in order to prevent the copper from diffusing into the dielectric layer.

In general, the copper damascene process requires CMP agents providing a good planarization, i.e. a high MMR, combined with a low static etch rate SER. Typically, the desired MRR/SER ratio is approximately 40 or higher. Moreover, the selectivity of the copper CMP agents have to be very high, i.e., the copper MRR must be much higher than the barrier layer MRR. Typically, the selectivity must be greater than 100:1, e.g., about 100:1 to about 400:1.

Even if this property profile is achieved, additional problems arise during copper CMP. These problems are caused by the fact that the conditions and requirements at the end of the CMP process differ from those at the beginning.

Thus, the bulk of the copper is rapidly removed during CMP. During this process, the temperature of the CMP agent increases and, at the end of the process, is about 10 to 20° C. higher than at the beginning. In addition, when hydrogen peroxide is used as the oxidizing agent, its decomposition is accelerated by the increasing copper concentration. On the other hand, the protrusions on the polished surface have almost disappeared. All in all, this renders the CMP slurry much more aggressive than at the beginning.

Quite contrary to this, a much lower MRR is needed at the final stage of the CMP process in order to prevent dishing and/or erosion, in particular during the so-called "over-polishing", and thus, loss of wafer surface planarity and uniformity. Generally, over-polishing is required to remove residuals of copper from the polished surface. Dishing occurs when the copper and the barrier MRR are disparate and as such, too much copper is removed such that the copper surface in the features is recessed relative to the barrier and/or dielectric surface of the microelectronic device wafer. Oxide erosion occurs when too much dielectric material is removed.

In order to ameliorate or completely avoid these problems, techniques of so-called "soft landing" or "touchdown" have been developed.

Thus, the temperature soft landing technique involves the cooling of the CMP agents and/or the pad. However, this requires additional equipment which increases the overall costs of the manufacturing process.

The chemical soft landing technique involves the use of two CMP agents: an aggressive CMP agent at the beginning of the CMP process and a less aggressive CMP agent at the end of the CMP process. The second, less aggressive CMP agent can be obtained by diluting the first CMP agent (cf. the American patent U.S. Pat. No. 7,161,603 B2) or by adding supplementary additives (cf. the American patent application US2008/0254628 A1). However, this technique requires a particularly careful monitoring of the CMP process in order to detect the appropriate time for applying the second CMP agent.

The mechanical soft landing technique involves the lowering of the downforce and/or the rotational speed of the polishing pad. By way of this technique it was possible to reduce problems like dishing and micro-scratching and to enhance the copper/barrier selectivity. However, due to the increasing demand in lowering the initial downforce, there will be no downforce gap left to achieve the mechanical soft landing. Furthermore, with the high chemical activity of the copper CMP agents, the Prestonian response is getting smaller and smaller. Moreover, it is very costly to upgrade the polishers to handle downforces <3.448 kPa (<0.5 psi).

Consequently, it would be highly desirable to have a CMP agent and a CMP process at hand which could avoid all the disadvantages associated with the prior art soft landing techniques.

The international patent application WO 2006/074248 A2 discloses CMP agents containing composite non-polymeric organic particles as the abrasives. The composite non-polymeric organic particles are engineered to control the events during CMP, in which the particles undergo dynamic changes and provide functions that are not available with conventional inorganic abrasive particles. According to the application, they serve as an abrasive to cut through the surface to-be-polished, as a carrier to deliver a desired ingredient and/or to take away abraded materials from the surface that is being polished. Preferably, the particles provide both a static complexation with the metal surface as well as a dynamic increase in complexing agent concentration. For copper CMP, melamine and its derivatives are preferably used for core structure of the particles. The relevant CMP agents can provide desirable amounts of complexing agents in-situ dynamically. This is accomplished locally according to surface topography. Thus, a region with higher topography that experiences greater local temperature changes or shear force will be provided with a greater amount of complexing agent dynamically, e.g., by the disintegration of the particles at the protrusions of the topography. However, this mechanism leads to an increase in the concentration of the complexing agents during the CMP, which behavior is contrary to the requirements of a soft landing CMP process.

Besides the complexing agents, multiple solid chemical components such as film-forming agents derived from benzotriazole, oxidizing agents, passivating agents or catalytic agents can be encapsulated in the non-polymeric particles. The non-polymeric particles can also have a core-shell structure, wherein the core consisting of, for example, melamine is coated with a solid film-forming agent as the shell. However, no soft landing behavior is disclosed for this embodiment, too.

OBJECTS OF THE INVENTION

It was the object of the present invention to suggest a novel process for removing a bulk material layer from the surface of a substrate and planarizing the exposed surface by chemical mechanical polishing (CMP), which process no longer exhibits the disadvantages of the prior art processes.

In particular, the said novel process should allow for a soft landing of the CMP process in the over-polishing stage with significantly reduced scratching, dishing and erosion of the exposed surface of the substrate including metal patterns embedded in said surface. These advantages should be particularly achieved in the shallow trench isolation (STI) process and the copper damascene process. Moreover, these advantages should be achieved without the use of costly additional and/or modified equipment and/or the use of at least two CMP agents in one CMP process.

Additionally, it was the object of the present invention to provide a novel aqueous chemical mechanical polishing agent (CMP agent) which can be used in a process for removing bulk material layer from the surface of a substrate and planarizing the exposed surface by CMP, which novel CMP agent should no longer exhibit the disadvantages of the prior art CMP agents.

In particular, the novel CMP agent should allow for a soft landing of the CMP process in the over-polishing stage with significantly reduced scratching, dishing and erosion of the exposed surface of the substrate including metal patterns embedded in said surface. These advantages should be particularly achieved in the STI process and the copper damascene process. Moreover, these advantages should be achieved without the use of costly additional and/or modified equipment and/or the use of at least two CMP agents in one CMP process.

Furthermore, it was the object of the present invention to provide a novel use of the novel CMP process and the novel CMP agent for the manufacture of electrical and optical devices.

SUMMARY OF THE INVENTION

Accordingly, a novel aqueous chemical mechanical polishing agent (A) comprising at least one type of solid particles (a1) has been found, the said solid particles (a1) containing
(a11) at least one corrosion inhibitor for metals, and
(a12) at least one solid material,
the said solid particles (a1) being finely dispersed in the aqueous phase.

Hereinafter, the novel aqueous chemical mechanical polishing agent (A) is referred to as the "CMP agent of the invention".

Accordingly, a novel process for removing a bulk material layer from the surface of a substrate and planarizing the exposed surface by chemical mechanical polishing has been found, the said process comprising the steps of
(1) providing an aqueous chemical mechanical polishing agent (A) exhibiting at the end of the chemical mechanical polishing, without the addition of supplementary materials,
   the same or essentially the same static etch rate SER as at its start and a lower material removal rate MRR than at its start,
   lower SER at the end than at the start and the same or essentially the same MRR or
   a lower static etch rate SER and a lower material removal rate MRR than at its start;

(2) contacting the surface of the bulk material layer with the said aqueous chemical mechanical polishing agent (A);

(3) chemically and mechanically polishing the bulk material layer with the said aqueous chemical mechanical polishing agent (A) whilst its initial SER remains the same or essentially the same and its initial MRR decreases, its initial SER decreases and its initial MRR remains the same or essentially the same or its initial SER and its initial MRR both decrease, until the bulk material layer is removed and the substrate surface is exposed; and (4) continuing the chemical mechanical polishing with the chemical mechanical polishing agent (A) having, at this stage of the process, a SER which is the same or essentially the same as the initial SER and a MRR which is lower than the initial MRR, a SER which is lower than the initial SER and a MRR which is the same or essentially the same as the initial MRR a SER and a MRR which are both lower than the initial SER and the initial MRR, until all material residuals are removed from the exposed surface.

Hereinafter, the novel process for removing a bulk material layer from the surface of a substrate and planarizing the exposed surface by chemical mechanical polishing is referred to as the "process of the invention".

Last but not least, the novel use of the process and the CMP agents of the invention for the manufacture of electrical and optical devices has been found.

Advantages of the Invention

In view of the prior art discussed above, it was surprising and could not be expected by the skilled artisan that the objects underlying the present invention could be solved by the CMP agent, the process and the use of the invention.

Thus, the CMP agent of the invention no longer exhibited the disadvantages of the prior art CMP agents. In particular, the CMP agent of the invention was excellently suited for the use in a process for removing a bulk material layer from the surface of a substrate and planarizing the exposed surface by CMP. In this regard, it was even more surprising that the CMP agent of the invention exhibited an excellent soft landing behavior. Therefore, the CMP agent of the invention was excellently suited for the use in the CMP process of the invention.

Especially, the CMP agent of the invention allowed for a soft landing of the CMP process in the over-polishing stage with significantly reduced scratching, dishing and erosion of the exposed surface of the substrate including the metal patterns embedded in said surface. These advantages were particularly achieved in the STI process and the copper damascene process. Moreover, these advantages were achieved without the use of costly additional and/or modified equipment and/or the use of at least two CMP agents in one CMP process.

The process of the invention no longer exhibited the disadvantages of the prior art CMP processes. In particular, the process of the invention allowed for a soft landing in the over-polishing stage with significantly reduced scratching, dishing and erosion of the exposed surface of the substrate including the metal patterns embedded in said surface. These advantages were particularly achieved in the STI process and the copper damascene process. Moreover, these advantages were achieved without the use of costly additional and/or modified equipment and/or the use of at least two CMP agents in one CMP process.

Furthermore, all in accordance with the use of the invention, the process and the CMP agent of the invention were particularly well-suited for the manufacture of electrical devices, in particular, semiconductor integrated circuits (ICs); liquid crystal panels; organic electroluminescent panels; printed circuit boards; micro machines; DNA chips and micro plants; preferably ICs with LSI (large-scale integration) or VLSI (very-large-scale integration); and optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; and magnetic heads.

DETAILED DESCRIPTION OF THE INVENTION

In its broadest aspect, the present invention is directed to a CMP agent (A) comprising at least one type of solid particles (a1) comprising or consisting of at least one corrosion inhibitor (a11) for metals and at least one solid material (a12), the said solid particles (a1) being finely dispersed in the aqueous phase of the CMP agent (A).

In the context of the present invention, "solid" means that the relevant solid components of the CMP agent of the invention have melting points above room temperature, preferably above 30° C. and most preferably above 50° C.

The solid particles (a1) can be primary particles, aggregates or agglomerates or mixtures of primary particles and aggregates and/or agglomerates or mixtures of aggregates and agglomerates. Preferably, they are primary particles.

The particle size of the solid primary particles (a1) can vary very broadly and, therefore, can be adapted most advantageously to particular requirements and conditions of the process and the use of the invention. Preferably, the particle size is in the range of from 10 nm to 20 µm, more preferably 25 nm to 10 µm, even more preferably 50 nm to 5 µm and most preferably 100 nm to 1 µm, as measured by dynamic laser light scattering.

The particle size distribution of the solid primary particles (a1) can also very broadly and, therefore, can be adapted most advantageously to particular requirements and conditions of the process and the use of the invention. Thus, the distribution can be broad or narrow, monomodal, bimodal or multimodal. Preferably, for purposes of having reproducible applicational properties, the distribution is narrow and monomodal. More preferably, the average particle size $d_{50}$ of the solid primary particles (a1) is in the range of from 10 nm to 15 µm, more preferably 25 nm to 10 µm, even more preferably 50 nm to 5 µm and most preferably 100 nm to 1 µm as measured by dynamic laser light scattering.

The solid particles (a1) can have different three-dimensional shapes, as for example, cubes, prisms, platelets, cylinders, needles, pyramids, octahedrons and icosahedrons with or without protrusions and indentations and with sharp or chamfered edges as well as spherical shapes, in particular spheres, with or without protrusions and indentations. Most preferably, the solid particles (a1) are spherical.

The solid particles (a1) contain at least one, preferably one corrosion inhibitor (a11) for metals, in particular the metals hereinafter described.

In principle, any corrosion inhibitor, passivating agent or film-forming agent customarily used in the art of the CMP can be used as the corrosion inhibitor (a11) of the CMP agent of the invention, provided that the corrosion inhibitor (a11) itself is a solid or if it is not a solid, it is encapsulated by the solid polymeric material (a12) in such a way that it does not disadvantageously interfere with the structural integrity and solidity of the solid particles (a1). Preferably, the corrosion inhibitor (a11) is solid.

The solid corrosion inhibitor (a11) can be single crystalline, polycrystalline or non-crystalline, i.e., amorphous, or a mixture of at least two of these forms.

Preferably, the solid corrosion inhibitor (a11) is selected from the group consisting of substituted and unsubstituted triazoles, tetrazoles, thiazoles, thiadiazoles, imidazoles, triazines, ureas, thioureas and phosphates.

Preferably, the substituents of the solid corrosion inhibitor (a11) are selected from the group consisting of halogen atoms and hydroxy, thiol, amino, imino, carboxy and nitro groups, and substituted and unsubstituted groups containing or consisting of alkyl, cycloalkyl and aryl groups.

Suitable examples for such solid corrosion inhibitors (a11) are known, for example, from the US patent application US 2008/0254628 A1, paragraph [0058] bridging the pages 4 and 5.

More preferably, the solid corrosion inhibitor (a11) is selected from the group consisting of substituted an unsubstituted triazoles and tetrazoles. Even more preferably, the triazoles (a11) are selected from the group consisting of benzotriazole and substituted triazoles, and the tetrazoles (a11) are selected from the group consisting of 5-substituted 1H-tetrazoles.

Even more preferably, the 5-substituted 1H-tetrazoles (a11) are selected from the group consisting of 5-amino-1H-tetrazole and 5-aryl-1H-tetrazoles, 5-phenyl-1H-tetrazole (PTA) being most preferably used.

Furthermore, the solid particles (a1) contain at least one, preferably one solid material (a12).

In principle, any known solid polymeric material can be used, provided it is not dissolved or decomposed by the components of the CMP agent of the invention at the beginning of CMP process, in particular by water.

Thus, the solid material (a12) can be an inorganic material such as a metal oxide, in particular silicon dioxide, customarily used as an abrasive in CMP or an organic material.

More preferably, the solid material (a12) is selected from the group consisting of synthetic and modified and unmodified naturally occurring polymers, i.e., biopolymers.

The synthetic polymeric material (a12) can be a conventional thermoplastic polymer, preferably having a glass transition temperature above room temperature, preferably above 30° C. and, most preferably, above 50° C. or a conventional duroplastic material, i.e., a cross-linked material.

Examples for suitable synthetic polymeric materials are linear and/or branched and/or comb-like homopolymers and statistical, alternating and/or block-like, linear and/or branched and/or comb-like copolymers of olefinically unsaturated monomers, or linear and/or branched and/or comb-like polyaddition polymers and/or polycondensation polymers. As regards these polymers, reference is made to Römpp Online 2009, "Polyaddition" and "Polykondensation".

Examples of suitable homopolymers and copolymers (a12) are acrylate and methacrylate homopolymers and copolymers and partially saponified polyvinyl esters.

Examples of suitable polyaddition and/or polycondensation polymers (a12) are polyesters, alkyd resins, polyurethanes, polylactones, polycarbonates, polyethers, epoxy amine adducts, polyureas, polyimides, polyether-polyurethanes, polyester-polyurethanes, and polyester-polyether-polyurethanes.

The modified or unmodified naturally occurring polymer or biopolymer (a12) is preferably selected from the group consisting of modified or unmodified nucleotides, proteins or polysaccharides, preferably modified and unmodified polysaccharides, preferably modified polysaccharides.

The polysaccharides (a12) are preferably selected from the group consisting of homopolysaccharides and heteropolysaccharides as well as proteoglycans, wherein the polysaccharide content exceeds the protein content.

In particular, modified and unmodified structure polysaccharides (a12), as for example, celluloses, lignocelluloses, chitin, chitosan and glucosaminoglycans are used. More preferably, modified cellulose, more preferably cellulose ethers, even more preferably cellulose methyl and ethyl ethers are used. Most preferably, cellulose ethyl ethers are used.

Therefore, the solid particles (a1) most preferably used contain or consist of 5-phenyl-1H-tetrazole (PTA) and cellulose ethyl ethers.

The mass ratio of the corrosion inhibitor (a11) to the solid polymeric material (a12) in a given solid particle (a1) can vary very broadly and, therefore, can be most advantageously adjusted to the requirements and conditions of the process and use of the invention. Preferably, the mass ratio is chosen such that the solid particles (a1) do not disintegrate during the storage, transportation and production of the CMP agent of the invention. Preferably, the mass ratio (a11):(a12) is in the range of from 1:100 to 100:1, more preferably 1:50 to 50:1 and, most preferably, 1:25 to 25:1.

The steric distribution of the components (a11) and (a12) in the solid particles (a1) can vary very broadly and, therefore, can be most advantageously adjusted to the particular chemical and physical properties of the components (a11) and (a12) as well as to the particular requirements and conditions of the process and use of the invention.

Although the corrosion inhibitor (a11) can form the outer surface or part of the outer surface of the solid particles (a1), it is particularly preferred that the solid polymeric material (a12) is forming at least the larger part of the outer surface, preferably the complete outer surface.

Thus, in a given solid particle (a1), the corrosion inhibitor (a11) can be a single solid particle which is coated by a layer of the polymeric material (a12). This way, a core-shell structure is obtained.

Moreover, the corrosion inhibitor (a11) can be a particulate, i.e., powdery, material which is encapsulated in a shell essentially consisting of or consisting of the polymeric material (a12) or which is finely distributed in a homogeneous matrix essentially consisting of or consisting of the polymeric material (a12).

Furthermore, both the corrosion inhibitor (a11) and the polymeric material (a12) can be powdery materials which are glued together by electrostatic forces, hydrogen bonds and/or covalent bonds.

Additionally, the three-dimensional distributions described hereinbefore can be combined in a given solid particle (a1).

The concentration of the solid particles (a1) in the CMP agent of the invention can also vary very broadly and, therefore, can be most advantageously adjusted to the requirements and conditions of the process and the use of the invention. Preferably, the concentration is chosen such that the CMP agent of the invention comprises of from 10 ppm to 5% by weight, more preferably 50 ppm to 2.5% by weight and, most preferably, 100 ppm to 1% by weight of the corrosion inhibitor (a11) as such, the weight percentages being based on the complete weight of the CMP agent of the invention.

If desired, the solid particles (a1) can contain at least one additional functional component (a13) customarily used in the art of CMP. Preferably, the additional functional components (a13) are solids and selected from the group of additional functional components (a2) hereinafter described.

The solid particles (a1) can be prepared according to various known and customary methods of preparing solid composite particles.

Moreover, finely divided solid corrosion inhibitor particles (a11) of the desired size can be spray-coated with solutions of at least one polymeric material (a12) in a fluidized bed. Thereafter, the resulting coated particles can be freeze-dried if necessary.

Or they can be contacted with a melt of at least one polymeric material (a12) in a suitable mixing device such as a kneader or an extruder, and, thereafter, the resulting compound can be ground and sifted to achieve the desired particle size and particle size distribution.

Moreover, they can be suspended in liquid precursors which can be cross-linked by heat and/or actinic radiation such as near infrared (NIR), visible light, UV light, x-rays, gamma rays or electron beams to yield duroplastic materials (a12) wherein the finely divided solid corrosion inhibitor particles (a11) are finely distributed. Thereafter, the resulting materials can also be ground and sifted to achieve the desired particle size and particle size distribution.

The CMP agent of the invention can furthermore contain at least one additional functional component (a2).

Preferably, the additional functional component (a2) is selected from the group consisting of additional corrosion inhibitors, organic, inorganic and hybrid organic-inorganic abrasive particles being different from the particles (a1), materials having a lower critical solution temperature LOST or an upper critical solution temperature UCST, oxidizing agents, passivating agents, complexing or chelating agents, frictive agents, stabilizing agents, pH-adjusting agents, buffering agents, rheology agents, surfactants, metal cations and organic solvents.

Preferably, the additional functional components (a2) are used in the effective amounts customarily employed in the art of CMP.

Suitable corrosion inhibitors (a2) of those described hereinbefore only that they are not incorporated in the solid particles (a1).

Also trace amounts of solid materials (a12) can be present in the aqueous phase of the CMP agent of the of the invention, i.e., outside the solid particles (a1), even under non-CMP conditions. These components are then also regarded as additional functional components (a2).

Suitable organic abrasive particles (a2) and their effective amounts are known, for example, from the American patent application US 2008/0254628 A1, page 4, paragraph [0054] or from the international application WO 2005/014753 A1, wherein solid particles consisting of melamine and melamine derivatives such as acetoguanamine, benzoguanamine and dicyandiamide are disclosed.

Suitable inorganic abrasive particles (a2) and their effective amounts are known, for example, from the international patent application WO 2005/014753 A1, page 12, lines 1 to 8 or the American patent U.S. Pat. No. 6,068,787, column 6, line 41 to column 7, line 65.

Suitable hybrid organic-inorganic abrasive particles (a2) and their effective amounts are known, for example, from the American patent applications US 2008/0254628 A1, page 4, paragraph [0054] or US 2009/0013609 A1, page 3, paragraph [0047] to page 6, paragraph [0087].

Suitable oxidizing agents (a2) and their effective amounts are known, for example, from the European patent application EP 1 036 836 A1, page 8, paragraphs [0074] and [0075] or from the American patents U.S. Pat. No. 6,068,787, column 4, line 40 to column 7, line 45 or U.S. Pat. No. 7,300,601 B2, column 4, lines 18 to 34. Preferably, organic and inorganic peroxides, more preferably inorganic peroxides, are used. In particular, hydrogen peroxide is used.

Suitable passivating agents (a2) and their effective amounts are known, for example, from the American patent U.S. Pat. No. 7,300,601 B2, column 3, line 59 to column 4, line 9 or from the American patent application US 2008/0254628 A1, the paragraph [0058] bridging the pages 4 and 5.

Suitable complexing or chelating agents (a2), which are sometimes also designated as frictive agents (cf. the American patent application US 2008/0254628 A1, page 5, paragraph [0061]) or etching agents or etchants (cf. the American patent application US 2008/0254628 A1, page 4, paragrap [0054]), and their effective amounts are known, for example, from the American patent U.S. Pat. No. 7,300,601 B2, column 4, lines with 35 to 48. The amino acids, in particular glycine, and, moreover, dicyandiamide and triazines containing at least one, preferably two and more preferably three primary amino groups such as melamine and water-soluble guanamines, particularly melamine, formoguanamine, acetoguanamine and 2,4-diamino-6-ethyl-1,3,5-triazine, are most particularly preferably use.

Suitable stabilizing agents (a2) and their effective amounts are known, for example, from the American patent U.S. Pat. No. 6,068,787, column 8, lines 4 to 56.

Suitable pH-adjusting agents and buffering agents (a2) and their effective amounts are known, for example, from the European patent application EP 1 036 836 A1, page 8, paragraphs [0080], [0085] and [0086], the international patent application WO 2005/014753 A1, page 12, lines 19 to 24, the American patent application US 2008/0254628 A1, page 6, paragraph [0073] or the American patent U.S. Pat. No. 7,300, 601 B2, column 5, lines 33 to 63. Most preferably, the pH of the CMP agent of the invention is adjusted to 3 to 7, particularly 4 to 6. Most preferably, nitric acid is used.

Suitable rheology agents (a2) and their effective amounts are known, for example, from the American patent application US 2008/0254628 A1, page 5, paragraph [0065] to page 6, paragraph [0069].

Suitable surfactants (a2) and their effective amounts are known, for example, from the international patent application WO 2005/014753 A1, page 8, line 23, to page 10, line 17 or from the American patent U.S. Pat. No. 7,300,601 B2, column 5, line 4 to column 6, line 8.

Suitable polyvalent metal ions (a2) and their effective amounts are known, for example, from the European patent application EP 1 036 836 A1, page 8, paragraph [0076] to page 9, paragraph [0078]. Most preferably, copper ions are used.

Suitable organic solvents (a2) and their effective amounts are known, for example, from the American patent U.S. Pat. No. 7,361,603 B2, column 7, lines 32 to 48 or the American patent application US 2008/0254628 A1, page 5, paragraph [0059].

Suitable materials (a2) exhibiting a lower critical solution temperature LOST or an upper critical solution temperature UCST are described, for example, in the article of H. Mori, H. Iwaya, A. Nagai and T. Endo, Controlled synthesis of thermoresponsive polymers derived from L-proline via RAFT polymerization, in Chemical Communication, 2005, 4872-

4874; or in the article of D. Schmaljohann, Thermo- and pH-responsive polymers and drug delivery, Advanced Drug Delivery Reviews, volume 58 (2006), 1655-1670 or in the American patent applications US 2002/0198328 A1, US 2004/0209095 A1, US 2004/0217009 A1, US 2006/0141254 A1, US 2007/0029198 A1, US 2007/0289875 A1, US 2008/0249210 A1, US 2008/0050435 A1 or US 2009/0013609 A1, the American patents U.S. Pat. No. 5,057,560, U.S. Pat. No. 5,788,82 and U.S. Pat. No. 6,682,642 B2, the international patent applications WO 01/60926 A1, WO2004/029160 A1, WO 2004/0521946 A1, WO 2006/093242 A2 or WO 2007/012763 A1, in the European patent applications EP 0 583 814 A1, EP 1 197 587 B1 and EP 1 942 179 A1, or the German patent application DE 26 10 705; or they are sold under the trademarks Pluronic™, Tetronic™ and Basensol™ by BASF Corporation and BASF SE as evidenced by the company brochure of BASF Corporation "Pluronic™ & Tetronic™ Block Copolymer Surfactants, 1996" or the American patent US 2006/0213780 A1.

The preparation of the CMP agent of the invention does not exhibit any particularities but can be carried out by dissolving or dispersing the above-described constituents (a1) and (a2) in an aqueous medium, in particular, de-ionized water. For this purpose, the customary and standard mixing processes and mixing apparatuses such as agitated vessels, in-line dissolvers, high shear impellers, ultrasonic mixers, homogenizer nozzles or counterflow mixers, can be used. Preferably, the CMP agents of the invention thus obtained can be filtered through filters of the appropriate mesh aperture, in order to remove coarse-grained particles such as the agglomerates or aggregates of the solid, finely dispersed abrasive particles (a2).

The CMP agent of the invention is most excellently suited for removing a bulk material layer from the surface of a substrate and planarizing the exposed surface by a CMP all in accordance with the process of the invention.

In the process of the invention, the CMP agent of the invention surprisingly exhibits, without the addition of supplementary materials,
  the same or essentially the same static etch rate SER as at its start and a lower material removal rate MRR than at its start,
  lower SER at the end than at the start and the same or essentially the same MRR or
  a lower static etch rate SER and a lower material removal rate MRR than at its start.

In the context of the present invention, "essentially the same" means that the initial SER differs from the final SER for ±10%, preferably ±9%, more preferably ±8% and, most preferably, ±7%, the percentages being based on the initial SER. This equally applies to the MRR.

The SER and MRR themselves can be varied broadly and, therefore, can be adapted in the most advantageous manner to the particularities and requirements of the equipment employed, the metals to be removed and the surfaces to be polished. Preferably, both at the beginning and the end of the CMP process of the invention, the MRR is higher than the SER in order to achieve a high planarization efficiency and to lower the danger of dishing and erosion. More preferably, the ratio of MRR to SER is chosen such that MRR/SER is greater than 10, even more preferably greater than 20, most preferably greater than 30 and particularly preferably greater than 40 both at the beginning and at the end of the CMP process of invention.

In the context of the present invention, the wording "without the addition of supplementary materials" means that no additional (i.e. supplementary) components, as for example, the components (a2) hereinafter described are added during the process of the invention, in order to change the physical and/or chemical properties of the CMP agent.

Because the addition of supplementary materials can be dispensed with, the process of the invention can be carried out in a much easier and simpler and less costly manner than the prior art soft landing CMP processes.

In the context of the present invention, the term "bulk material layer" designates a metal layer covering the surface of the substrate essentially completely or completely, including almost all or all of the features of the substrate such as recesses, indentations and protrusions.

The thickness of the bulk material layer can vary broadly and primarily depends on the dimensions of the features of the substrate and the electrical and optical devices which are to be prepared with the help of the process of the invention. Preferably, the thickness is of from 10 nm to 1 µm.

In the context of the present invention, the term "bulk material" includes all materials customarily used in the manufacture of ICs. Preferably, the bulk material is selected from the group consisting of dielectric materials, more preferably the dielectric materials hereinafter described, and electrically conductive materials, more preferably semiconductors and metals, most preferably metals. Most preferably, metals are used as the bulk materials.

In the context of the present invention, the term "metal" also includes metal alloys. Preferably, the metal has a standard reduction potential $E^0 > -0.1$ V, preferably $>0$ V, most preferably $>0.1$ V and in particular $>0.2$ V for the half-reaction $$M \leftrightarrow M^{n+} + ne^-,$$

wherein n=integer of from 1 to 4 and $e^-$=electron.

Examples for such standard reduction potentials $E^0 > -0.1$ are listed in the CRC Handbook of Chemistry and Physics, 79th edition, 1998-1999, CRC Press LLC, Electrochemical Series, 8-21 to 8-31.

Preferably, the metal is selected from the group consisting of Ag, Au, Bi, Cu, Ge, Ir, Os, Pd, Pt, Re, Rh, Ru, Tl and W, most preferably Ag, Au, Cu, Ir, Os, Pd, Pt, Re, Rh, Ru and W. In particular, the metal is copper.

The substrate can be any substrate customarily used for the manufacture of electrical devices, in particular, semiconductor integrated circuits (ICs); liquid crystal panels; organic electroluminescent panels; printed circuit boards; micro machines; DNA chips and micro plants; preferably ICs with LSI (large-scale integration) or VLSI (very-large-scale integration); and for the manufacture of optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; and magnetic heads.

Preferably, semiconductor wafers, in particular, silicon wafers are used as the substrate.

The semiconductor wafer substrate can be planar without structures or it can have features like protrusions or indentations or recesses. Preferably, the semiconductor wafer substrate is planar without such features.

Preferably, the surface of the substrate exposed during the process of invention contains embedded metal patterns. Particularly preferably, the metal patterns contain or consists of the above-mentioned metals.

More preferably, these metal patterns are embedded in a non-conducting or insulating layer which contains or consists of low-k or ultra low-k dielectric materials, which non-conducting layer has a pattern which is complementary to the metal patterns.

This non-conducting or insulating layer having metal patterns embedded therein can be directly located on top of the semiconductor wafer substrate, i.e., it is the first layer of the IC. The said layer can also be located on top of at least one layer produced on top of the semiconductor wafer. Such a lower layer may contain customary and known etch stop layers at its upper surface. Preferably, such a lower layer is produced using the process of the invention, and, most preferably, using the CMP agent of the invention in the said process.

Suitable low-k or ultra-low-k materials and suitable methods of preparing the insulating dielectric layers are described in, for example, the American patent applications US 2005/0176259 A1, page 2, paragraphs [0025] to [0027], US 2005/0014667 A1, page 1, paragraph [0003], US 2005/0266683 A1, page 1, paragraph [0003] and page 2, paragraph [0024] or US 2008/0280452 A1, paragraphs [0024] to [0026] or in the American patent U.S. Pat. No. 7,250,391 B2, column 1, lines 49 to 54 or in the European patent application EP 1 306 415 A2, page 4, paragraph [0031].

When copper is used as the metal, a barrier layer is customarily located between the copper and the low-k or ultra low-k dielectric material in order to prevent the diffusion of copper into the said material. Examples of suitable barrier layers are known from the European patent application EP 1 306 415 A2, page 4, paragraph [0032].

The dimensions of the metal patterns and the complementary dielectric patterns can vary broadly and depend on the electrical and optical devices to be prepared with the help of the process of the invention. Thus, for example, the dimensions of such patterns used for the manufacture of integrated circuits (ICs) with LSI (large-scale integration) or VLSI (very-large-scale integration) are <100 nm, preferably <50 nm.

In the first step of the process of the invention, the surface of the bulk material layer is contacted with the CMP agent of the invention.

In the second step of the process of the invention, the bulk material layer is chemically and mechanically polished with the CMP agent of the invention until the bulk material layer is removed and the substrate surface is exposed.

During this process step,
the initial SER remains the same or essentially the same whereas the initial MRR decreases,
the initial SER decreases and the initial MRR remains the same or essentially the same or
both the initial SER and the initial MRR decrease,
whereby a soft landing or touchdown is possible without the addition of supplementary materials including water.

Without wishing to be bound by a particular theory, it is believed that this soft landing behavior is effected by a controlled release of the corrosion inhibitor (a11) from the particles (a1).

Again, without wishing to be bound by a particular theory, it is believed that the controlled release can be triggered via the change of at least one chemical and/or physical property of the solid material (a12) by stimuli such as
(i) the change of the pH, the temperature or the concentration of the components (ex: $Cu^{2+}$ released during CMP) in the aqueous phase,
(ii) the exposure to a magnetic field, an electric field and electromagnetic radiation,
(iii) the exposure to mechanical stress, and
(iv) the combination of at least two of the said stimuli;
and, more preferably, by
(i) the change of the pH, the temperature or the concentration of the components (ex: $Cu^{2+}$ released during CMP) in the aqueous phase,
(iii) the exposure to mechanical stress, and
(iv) the combination of at least two of the said stimuli.

In the third step of the process of the invention, the chemical and mechanical polishing with the CMP agent of the invention is continued until all material residues are removed from the exposed surface. Preferably, the over-polishing is carried out for 5 to 120 seconds, more preferably 5 to 90 seconds and, most preferably, 5 to 60 seconds. As at this stage of the process of the invention, the CMP agent of the invention has
a SER which is the same or essentially the same as the initial SER and a MRR which is lower than the initial MRR or
a SER which is lower than the initial SER and a MRR which is the same or essentially the same as the initial MRR or
a SER and a MRR which are both lower than the initial SER and initial MRR at the start of the process,
meaning that
the initial SER has remained the same or essentially the same, whereas the initial MRR has decreased;
the initial SER has decreased and the initial MRR has remained the same or essentially the same
the initial SER and MRR both have decreased,
dishing, erosion and micro-scratching are significantly reduced, and the resulting polished and planarized surface is excellently suited for further processing in the course of the production of electrical and optical devices.

The polishing process of the invention exhibits no particularities but can be carried out with the processes and the equipment customarily used for the CMP in the fabrication of wafers with ICs.

As is known in the art, a typical equipment for the CMP consists of a rotating platen which is covered with a polishing pad. The wafer is mounted on a carrier or chuck with its upper side down facing the polishing pad. The carrier secures the wafer in the horizontal position. This particular arrangement of polishing and holding device is also known as the hard-platen design. The carrier may retain a carrier pad which lies between the retaining surface of the carrier and the surface of the wafer which is not being polished. This pad can operate as a cushion for the wafer.

Below the carrier, the larger diameter platen is also generally horizontally positioned and presents a surface parallel to that of the wafer to be polished. Its polishing pad contacts the wafer surface during the planarization process. During the CMP process of the invention, the CMP agent (A), in particular, the CMP agent of the invention is applied onto the polishing pad as a continuous stream or in dropwise fashion.

Both the carrier and the platen are caused to rotate around their respective shafts extending perpendicular from the carrier and the platen. The rotating carrier shaft may remain fixed in position relative to the rotating platen or may oscillate horizontally relative to the platen. The direction of rotation of the carrier typically, though not necessarily, is the same as that of the platen. The speeds of rotation for the carrier and the platen are generally, though not necessarily, set at different values.

Customarily, the temperature of the platen is set at temperatures between 10 and 70° C.

For further details reference is made to the international patent application WO 2004/063301 A1, in particular page 16, paragraph [0036] to page 18, paragraph [0040] in conjunction with the FIG. 1.

By way of the process of the invention and the CMP agent of the invention wafers with ICs comprising copper damascene patterns can be obtained which have an excellent planarity and in the finished IC an excellent electrical functionality

EXAMPLES

Synthesis Example

Preparation of the Particles (a1) by Encapsulation of 5-Phenyl-1-H-Tetrazole (PTA) in Cellulose Ethyl Ether Cellulose ethyl ether (about 0.001 parts by weight) were dissolved in ethanol (about 3.3 parts by weight). Finely-divided crystals of 5-phenyl-1-H-tetrazole (about 1 part by weight) were added to the resulting solution, whereafter the resulting solution was thoroughly stirred so as to form a suspension. The resulting suspension was then dried by spraying against a large flat surface. The capsules thus obtained possessed an inner core of 5-phenyl-1-H-tetrazole (PTA) enveloped by an outer sheath of cellulose ethyl ether. The particle size of the capsules was in the range of from about 30 nm to about 40 nm in diameter.

The dried capsules were added to water along dibasic potassium phosphate salt and stirred. Upon stirring, the capsule aggregates broke up to free the ethyl cellulose coated PTA particles in the form and the size they had in the original dispersion. It was found that the dibasic potassium phosphate in an amount of between 0.1 and 1.0%, based upon the weight of cellulose ethyl ether encapsulated PTA, produced the desired results.

Examples 1 to 4

The Preparation of a CMP Agents (A1) to (A4) Containing Solid Particles (a1)

A basic slurry was prepared for the preparation of the CMP agents (A1) to (A4) of the examples 1 to 4 having the following composition:
- 97.9% by weight of de-ionized water;
- 0.2% by weight of NexSil™ 20 A (aqueous colloidal silica from Nyacol having a pH of from 2.5 to 3 and a silica content of 30% by weight, the silica having a particle size of 20 nm and a specific surface area of 135 m²/g);
- 1.8% by weight glycine;
- 0.1% by weight dibasic potassium phosphate; and
- 5 mM per 100 parts of the basic slurry of 5-phenyl-1H-tetrazole coated with cellulose ethyl ether (particles a1) according to the synthesis example.

For the preparation of the CMP agent (A1) of the Example 1, the basic slurry was diluted with deionized water in a weight ratio of 1:3, whereafter hydrogen oxide (30% by weight in water) was added so that a hydrogen peroxide content of 2.5% by weight, based on the complete weight of the CMP agent (A1), was obtained.

For the preparation of the CMP agent (A2) of the Example 2, the basic slurry was diluted with deionized water in a weight ratio of 1:4, whereafter hydrogen peroxide (30% by weight in water) was added so that a hydrogen peroxide content of 2.5% by weight, based on the complete weight of the CMP agent (A2), was obtained. Additionally, 8 mM of 5-phenyl-1H-tetrazole coated with cellulose ethyl ether (particles a1) was added per 100 parts of the CMP agent (A2).

For the preparation of the CMP agent (A3) of the Example 3, the basic slurry was diluted and $H_2O_2$ was added as in the case of the Example 1 only that 1 mM of 5-phenyl-1H-tetrazole was additionally added per 100 parts of the CMP agent (A3).

For the preparation of the CMP agent (A4) of the Example 4, the basic slurry was diluted and $H_2O_2$ was added as described for the Example 1 only that a dilution factor of 1:3 (weight ratio) was employed.

The CMP agents (A1) to (A4) were excellently suited for removing bulk material layers from the surfaces of all kinds of substrates and for planarizing the exposed surfaces by CMP.

Examples of 5 to 8

Soft Landing Behavior of the CMP Agents (A1) to (A4) of the Examples 1 to 4

The soft landing behavior of the CMP agents (A1) to (A4) of the Examples 1 to 4 was demonstrated by the determination of the material removal rates MRRs (nm/mn), the Within-Wafer-Non-Uniformity WIWNU (%), the average surface roughness $R_a$ (nm) and the peak-to-valley ratio PV (µm) after a polishing time of 20 s and 45 s. Additionally, the static etch rates SERs (nm/min) were determined at 20° C. and 50° C.

The CMP agent (A1) of the Example 1 was used for the Example 5.
The CMP agent (A2) of the Example 2 was used for the Example 6.
The CMP agent (A3) of the Example 3 was used for the Example 7.
The CMP agent (A4) of the Example 4 was used for the Example 8.

The SERs were determined as follows.

Copper discs were initially conditioned, washed, dried and then weighed before each experiment. Copper disks were immersed for 10-20 seconds in 2% nitric acid and then rinsed with deionized $H_2O$ and subsequently dried with compressed air. Then Cu disks were directly immersed in the stirred CMP agents (A1) to (A4) in a first series at 20° C. in a second series at 50° C. for 5 minutes each. After the etching, the copper discs were cleaned with deionized water followed by an isopropyl alcohol rinse. Thereafter, the copper discs were dried with a steady stream of pressurized air, and the SER was calculated on the net weight-loss and the surface area of the disc using the following calculation:

$$SER = \text{Weight-loss}/[\text{Density} \times (\text{Circumferential Area} + 2 \times \text{Area of Cross-section}) \times \text{Time}],$$

wherein
Weight-loss=loss of weight in copper disc after dissolution;
Density=density of copper;
Area of Cross-section=cross-section area of the disc;
Circumferential Area=circumferential area of the disc; and
Time=dissolution time.

The results of the measurements are compiled in the Table 1.

The material removal rate MRRs were determined as follows:

Again, the copper discs were conditioned (as explained before), washed, dried and then weighed before each experiment. Thereafter, they were attached to a stainless steel carrier and then mounted on a single-side polishing machine (Strasbaugh 6EG polisher). A polyurethane IC 1000 polishing pad was used for the experiments. In a first series, the copper discs were polished for 20 s under a pressure of 6.896 kPa (1 psi) by supplying the CMP agents (A1) to (A4) at a rate of 200 ml/min each onto the pad at room temperature. The pad had a rotational speed of 75 rpm, and the platen had a rotational speed of 65 rpm. The pad was conditioned with diamond grit conditioner to remove the products of the chemical reactions and to make the pad ready for the next run. In a second series, the copper discs were polished for 45 s under the same conditions.

After polishing, the discs were cleaned with a deionized water rinse followed by an isopropyl alcohol rinse. Thereafter, the discs were dried with a steady stream of pressurized air, and the MRR was calculated based on the net weight-loss in the polished surface area according to the calculation:

MRR=Weight-loss/(Density×Area of Cross-section×Time);

wherein
Weight-loss=loss of weight in copper disc after polish;
Density=density of copper;
Area of Cross-section=cross-section area of the disc; and
Time=polishing time.

The WIWNUs were determined using Zygo NewView 6000

The results of the measurements are also compiled in the Table 1.

The $R_a$s were determined using Zygo NewView 6000 at the centers and the edges of the wafers.

The PVs were determined using Zygo NewView 6000 at the centers and the edges of the wafers.

The results of the measurements are also compiled in the Table 2.

TABLE 1

Application Properties of the CMP Agents (A1) to (A4) of the Examples 1 to 4: Material Removal Rate MRR, Static Etch Rate SER and Within-Wafer-Non-Uniformity WIWNU

| Example | MRR@ 20 s/nm/min (WIWNU/%) | MRR@ 45/nm/min (WIWNU/%) | SER@ 20° C./ nm/min | SER@ 50° C./ nm/min |
|---|---|---|---|---|
| 5 | 575.1 (7.6) | 420.7 (5.1) | 11.5 | 7.8 |
| 6 | 318.9 (22) | 275.7 (26) | 0 | 0 |
| 7 | 558 (6.6) | 410.1 (6.4) | 11.1 | 5.8 |
| 8 | 633.8 (8.1) | 479.9 (4.2) | 13.2 | 9.9 |

All the CMP agents (A1) to (A4) tested showed a significant decrease of their MRR with increasing polishing time. Moreover, the CMP agents (A1) and (A3) and (A4) also showed a significant decrease of their SER with increasing temperature. Therefore, they were ideally suited for a soft landing CMP. Moreover, the ratio MRR/SER was above 48 for the CMP agents (A1) and (A3) and (A4) (cf. the Examples 5 and 7 and 8) so that the planarization efficiency was also high. Due to the comparatively high concentration of corrosion inhibitor, the CMP agent (A2) showed no etching behavior and a comparatively low MRR (cf. the Example 6).

The invention claimed is:

1. An aqueous chemical mechanical polishing agent (A) comprising at least one type of solid particles (a1) finely dispersed in an aqueous phase,
    wherein the at least one type of solid particles comprise:
    (a11) a metal corrosion inhibitor, and
    (a12) at least one solid material selected from the group consisting of a synthetic polymer, a modified naturally occurring polymer, and an unmodified naturally occurring polymer, wherein said synthetic polymer is a thermoplastic polymer or a duroplastic material,
    wherein the metal corrosion inhibitor (a11) is a particulate material encapsulated in a shell essentially consisting of the at least one solid material (a12) or the corrosion inhibitor is a particulate material finely distributed in a homogeneous matrix essentially consisting of the at least one solid material (a12).

2. The aqueous chemical mechanical polishing agent (A) of claim 1, further comprising an additional functional component (a2).

3. The aqueous chemical mechanical polishing agent (A) of claim 2,
    wherein the additional functional component (a2) is at least one component selected from the group consisting of organic, inorganic, or hybrid organic-inorganic abrasive particles different from the solid particles (a1); a material having a lower critical solution temperature LCST or an upper critical solution temperature UCST; an oxidizing agent; a passivating agent; a complexing agent; a chelating agent; a fictive agent; a stabilizing agent; a pH-adjusting agent; a buffering agent; a rheology agent; a surfactant; a metal cation; and an organic solvent.

4. The aqueous chemical mechanical polishing agent (A) of claim 1,
    wherein the at least one solid material comprises a modified polysaccharide as a modified naturally occurring polymer.

5. The aqueous chemical mechanical polishing agent (A) of claim 4,
    wherein the modified polysaccharide comprises a cellulose alkyl ether.

6. The aqueous chemical mechanical polishing agent (A) of claim 5,
    wherein the cellulose alkyl ether comprises a cellulose ethyl ether.

7. The aqueous chemical mechanical polishing agent (A) of claim 1, wherein the metal corrosion inhibitor (a11) comprises a solid corrosion inhibitor.

8. The aqueous chemical mechanical polishing agent (A) of claim 7,
    wherein the solid corrosion inhibitor is at least one substituted or unsubstituted solid corrosion inhibitor selected from the group consisting of a triazole, a tetrazole, a thiazole, a thiadiazole, an imidazole, a triazine, an urea, a thiourea, and a phosphate.

9. The aqueous chemical mechanical polishing agent (A) of claim 8,
    wherein the solid corrosion inhibitor is substituted by at least one group selected from the group consisting of a halogen atom, a hydroxyl group, a thiol group, an amino group, an imino group, a carboxy group, a nitro group, a substituted group comprising an alkyl group, a substituted group comprising a cycloalkyl group, a substituted group comprising an aryl group, an unsubstituted group comprising an alkyl group, an unsubstituted group comprising a cycloalkyl group, and an unsubstituted group comprising an aryl group.

10. The aqueous chemical mechanical polishing agent (A) of claim 8,
    wherein the solid corrosion inhibitor is at least one inhibitor selected from the group consisting of a substituted triazole, an unsubstituted triazole a substituted tetrazole, and an unsubstituted tetrazole.

11. The aqueous chemical mechanical polishing agent (A) of claim 10, wherein the solid corrosion inhibitor is at least one inhibitor selected from the group consisting of a benzotriazole, a substituted triazole, and a 5-substituted 1H-tetrazole.

12. The aqueous chemical mechanical polishing agent (A) of claim 11,
wherein the solid corrosion inhibitor comprises at least one 5-substituted 1H-tetrazole selected from the group consisting of 5-amino-1H-tetrazole and 5-aryl-1H-tetrazole.

13. The aqueous chemical mechanical polishing agent (A) of claim 12, wherein the solid corrosion inhibitor comprises 5-phenyl-1H-tetrazole.

14. A process for removing a bulk material layer from a surface of a substrate and planarizing the surface, the process comprising:
contacting a surface of the bulk material layer with the aqueous chemical mechanical polishing agent (A) of claim 1;
chemically and mechanically polishing, in a first polishing, the bulk material layer with the aqueous chemical mechanical polishing agent (A) until the bulk material layer is removed and the substrate surface is exposed; and
further chemically and mechanically polishing, in a second polishing, with the chemical mechanical polishing agent (A) until all material residual is removed,
wherein, during the first polishing, a static etch rate SER of the aqueous chemical mechanical polishing agent (A) remains the same or essentially the same and a material removal rate MRR of the aqueous chemical mechanical polishing agent (A) decreases, the SER decreases and the MRR remains the same or essentially the same, or the SER and the MRR both decrease,
when the second polishing begins, the chemical mechanical polishing agent (A) has a SER which is the same or essentially the same as an initial SER and a MRR which is lower than an initial MRR, a SER which is lower than the initial SER and a MRR which is the same or essentially the same as the initial MRR, or a SER and an MRR which are respectively lower than the initial SER and the initial MRR, and
after the process, the chemical mechanical polishing agent (A) has a SER which is the same or essentially the same as the initial SER and a lower MRR than the initial MRR, a lower SER than the initial SER and the same or essentially the same MRR as the initial MRR, or a lower SER and a lower MRR respectively than the initial SER and the initial MRR.

15. The process of claim 14, wherein the bulk material layer is a metal layer.

16. The process of claim 14, wherein the bulk material layer is a layer of a metal selected from the group consisting of Ag, Au, Cu, Ir, Os, Pd, Pt, Re, Rh, Ru, and W.

17. The process of claim 14, wherein the bulk material layer is a copper layer.

18. A process for manufacturing an electrical device, an optical device, or both, the process comprising:
removing a bulk material layer from a surface of a substrate and planarizing the surface, by the process of claim 14.

* * * * *